United States Patent
Andrys et al.

(10) Patent No.: US 8,749,273 B2
(45) Date of Patent: Jun. 10, 2014

(54) POWER AMPLIFIER SATURATION DETECTION

(75) Inventors: Paul Raymond Andrys, Swisher, IA (US); Michael Lynn Gerard, Cedar Rapids, IA (US); Terrence John Shie, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 162 days.

(21) Appl. No.: 13/348,546

(22) Filed: Jan. 11, 2012

(65) Prior Publication Data

US 2012/0115426 A1 May 10, 2012

Related U.S. Application Data

(63) Continuation of application No. 12/259,645, filed on Oct. 28, 2008, now Pat. No. 8,103,226.

(51) Int. Cl.
*G01R 19/00* (2006.01)
*G11C 7/06* (2006.01)

(52) U.S. Cl.
CPC .................................. *G11C 7/067* (2013.01)
USPC ............................................................ 327/51

(58) Field of Classification Search
USPC ................... 327/51–57, 63–81, 563; 365/203
See application file for complete search history.

(56) References Cited

U.S. PATENT DOCUMENTS

| | | | |
|---|---|---|---|
| 5,208,550 A | 5/1993 | Iwane | |
| 7,738,845 B2 | 6/2010 | Takahashi et al. | |
| 7,756,494 B2 | 7/2010 | Fujioka et al. | |
| 7,933,570 B2 | 4/2011 | Vinayak et al. | |
| 7,973,587 B2 * | 7/2011 | Yang et al. | 327/359 |
| 2001/0014587 A1 | 8/2001 | Ichihara | |
| 2003/0092407 A1 | 5/2003 | Nitta | |
| 2007/0222697 A1 | 9/2007 | Caimi et al. | |
| 2007/0259628 A1 | 11/2007 | Carmel et al. | |
| 2008/0224769 A1 | 9/2008 | Markowski et al. | |
| 2010/0238844 A1* | 9/2010 | Kanou | 370/278 |

FOREIGN PATENT DOCUMENTS

| | | |
|---|---|---|
| EP | 1093286 | 4/2001 |
| WO | WO 00/16474 A1 | 3/2000 |
| WO | WO 2004/027990 A1 | 4/2004 |
| WO | WO2010/062533 | 6/2010 |

OTHER PUBLICATIONS

International Search Report dated Jun. 11, 2010 of PCT/US2009/061991 in 4 pages.
International Search Report, Written opinion of PCT/US/2009/061991 dated Jun. 11, 2010 in 4 pages.
International Preliminary Report on Patentability dated May 13, 2011of PCT/US2009/061991 in 5 pages.
Supplementary European Search Report for PCT/US2009/061991 (appl. No. EP 09829559.5) completed on Feb. 24, 2012 in 6 pages.

* cited by examiner

*Primary Examiner* — Sibin Chen
(74) *Attorney, Agent, or Firm* — Knobbe, Martens, Olson & Bear, LLP

(57) ABSTRACT

In a portable radio transceiver, a power amplifier system includes a saturation detector that detects power amplifier saturation in response to duty cycle of the amplifier transistor collector voltage waveform. The saturation detection output signal can be used by a power control circuit to back off or reduce the amplification level of the power amplifier to avoid power amplifier control loop saturation.

25 Claims, 4 Drawing Sheets

POWER AMPLIFIER SATURATION DETECTION

CROSS-REFERENCED APPLICATION

This application is a continuation of U.S. patent application Ser. No. 12/259,645, filed Oct. 28, 2008, entitled "POWER AMPLIFIER SATURATION DETECTION," which is hereby incorporated by reference in its entirety.

BACKGROUND

Radio frequency (RF) transmitters of the type used in mobile wireless telephones (also known as cellular telephones) and other portable radio transceivers commonly include transmit power control circuitry that adjusts the power of the transmitted RF signal. The power control circuitry can adjust a power amplifier to increase or decrease the transmitted RF power. Adjusting transmitted RF power is useful for several purposes. For example, in many types of cellular telecommunications systems, it is useful for transmitted RF power to be higher when the transceiver (also referred to as a handset) is farther from the nearest base station and lower when the transceiver is closer to the nearest base station. Also, in some types of multi-mode (e.g., dual-mode) transceivers, such as those that are capable of operating in accordance with both the GSM (Global System for Mobile telecommunication) standard and EDGE (Enhanced Data rates for GSM Evolution) standard, requirements for transmitted RF power differ depending on whether the transceiver is operating in GSM mode or EDGE mode. Similarly, requirements for transmitted RF power can differ in multi-band (e.g., dual-band) transceivers, such as those that are capable of operating in both a GSM "low band" frequency band (e.g., the 880-915 MHz frequency band that is used in much of Europe, Africa, the Middle East and Asia) and a GSM "high band" frequency band (e.g., the 1850-1910 MHz frequency band that is used in the United States). To accommodate different power amplification requirements for multiple bands, the power amplifier system of the transceiver may correspondingly include multiple power amplifiers.

In some applications, the power amplifier system of a portable radio transceiver includes a negative feedback power control loop to adjust the output power of the power amplifier to a level within the tolerance range specified by the mode under which the transceiver is operating. For example, while a transceiver is transmitting in GSM mode, the power control loop strives to maintain the amplifier output power within the tolerance range specified by the GSM standard for the frequency-shift keying-modulated (specifically, Gaussian Minimum Shift Keying (GMSK)) signal that is transmitted in accordance with the GSM standard. Likewise, while the transceiver is transmitting in EDGE mode, the control loop strives to maintain the amplifier output power within the tolerance range specified by the EDGE standard for the 8-phase-shift keying (8PSK)-modulated signal that is transmitted in accordance with the EDGE standard. In general, the feedback loop compares a feedback quantity, such as detected RF output power level, with a reference control voltage. The difference between the two voltages (also referred to as difference error) is integrated and applied to the power control port of the power amplifier. For GMSK, the power amplifier power control port is typically a voltage controlled input (V_PC), which adjusts the power amplifier bias. The RF input level is fixed. For EDGE, the power amplifier power control port is the RF input level. In EDGE, V_PC can also be adjusted to optimize efficiency while maintaining linearity. The large loop gain minimizes the difference error and drives the output power accuracy to the precision of the loop feedback circuitry and reference control voltage.

A power amplifier control loop can undesirably voltage-saturate under conditions such as insufficient battery power and VSWR (voltage standing wave ratio) load line extremes. Such conditions can cause an undesirable decrease in control loop gain, increase in difference error, or both. These effects can manifest themselves in sluggish control loop response, resulting in drifting power amplifier output power level or even complete loss of control loop lock.

Power control loop saturation can also result in switching spectrum degradation and nonconformance with applicable transmission standards (e.g., GMSK), such as exceeding power-versus-time (PvT) measurements specified by the applicable standard. Furthermore, peaks of an amplitude-modulated EDGE signal envelope can become clipped, causing modulation spectrum degradation.

To avoid power control loop saturation, some power amplifier systems have included circuitry that monitors the loop error voltage and reduces the loop reference voltage until the loop error is eliminated. Alternatively, a power amplifier system can include saturation detection circuitry that detects when the control loop is nearing saturation and activates a "saturation detect" signal. The power control circuitry responds to this signal by reducing the target output power until the saturation detection circuitry deactivates the "saturation detect" signal, indicating normal or non-saturated control loop operation.

For example, as illustrated in FIG. 1, the gain, or amplification, of a power amplifier 10 is controlled by a voltage regulator 12 comprising an operational amplifier 13, a PFET (p-channel field-effect transistor) 14, and associated resistors 16 and 18. Power amplifier 10 can include a number of cascaded stages, but only the transistor 20 of the final stage is shown for purposes of clarity (other such stages being indicated by the ellipsis (" . . . ") symbol). Voltage regulator 12 is responsive to a power control signal (V_PC) that is produced by power control circuitry (not shown for purposes of clarity). Note that the output of operational amplifier 13 is coupled via PFET 14 to the collector terminal of transistor 20. Such an arrangement provides what is known as collector voltage amplifier control (COVAC).

The circuitry for generating a "saturation detect" signal includes a comparator 22, a current source 24, and a resistor 26. A power supply voltage (V_BATT) provided by a battery-operated power supply (not shown for purposes of clarity) is coupled to the source terminal of PFET 14 and one terminal of resistor 26. A power supply-dependent reference voltage is applied to one terminal of comparator 22 via resistor 26 and current source 24. The other terminal of comparator 22 receives the drain voltage of PFET 14. If the PFET 14 drain voltage exceeds the comparator reference voltage, comparator 22 generates a "saturation detect" signal indicating that the voltage regulator is saturated. The regulator gain-bandwidth is insufficient to accurately follow the V_PC input signal, resulting in power amplifier PvT time mask and switching spectrum specification violations.

While the technique described above with reference to FIG. 1 for detecting when a power amplifier control loop is in or near saturation is useful in a power amplifier system having a COVAC transistor arrangement, the technique cannot be used in some other cases. For example, in some power amplifier transistor arrangements, the collector of the final-stage transistor is directly connected to the power supply voltage (V_BATT).

SUMMARY

Embodiments of the invention relate to a power amplifier system in a portable radio frequency (RF) transmitter or transceiver, to a mobile wireless telecommunication device having such a transceiver, and to a method of operation of the power amplifier system, where the power amplifier system includes a saturation detector that detects power amplifier saturation.

In an exemplary embodiment, the power amplifier circuit includes a power amplifier, a duty cycle detector, and a comparator section. The power amplifier has at least one output transistor having an output transistor terminal coupled to a supply voltage. The duty cycle detector can provide an indication of power amplifier saturation by detecting the duty cycle or ratio between the amount of time that the waveform produced at the output transistor terminal is negative and the amount of time that the waveform is positive.

In an exemplary embodiment, the duty cycle detector can include a limiter section and an averaging filter section. The limiter section is coupled to the output transistor terminal and blocks positive voltage excursions while passing negative voltage excursions. The averaging filter section is coupled to an output of the limiter section. The comparator section produces a saturation detection output signal by comparing the signal that is output by the averaging filter section with a reference voltage. The saturation detection output signal can be used by a power control circuit to back off or reduce the amplification level of the power amplifier to avoid operating in saturation. The limiter section, averaging filter section, and comparator section or portions thereof can be embodied in any suitable circuitry or systems, such as discrete circuitry formed in an integrated circuit chip, in programmed or configured digital signal processing logic, or in any other suitable circuitry or systems.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
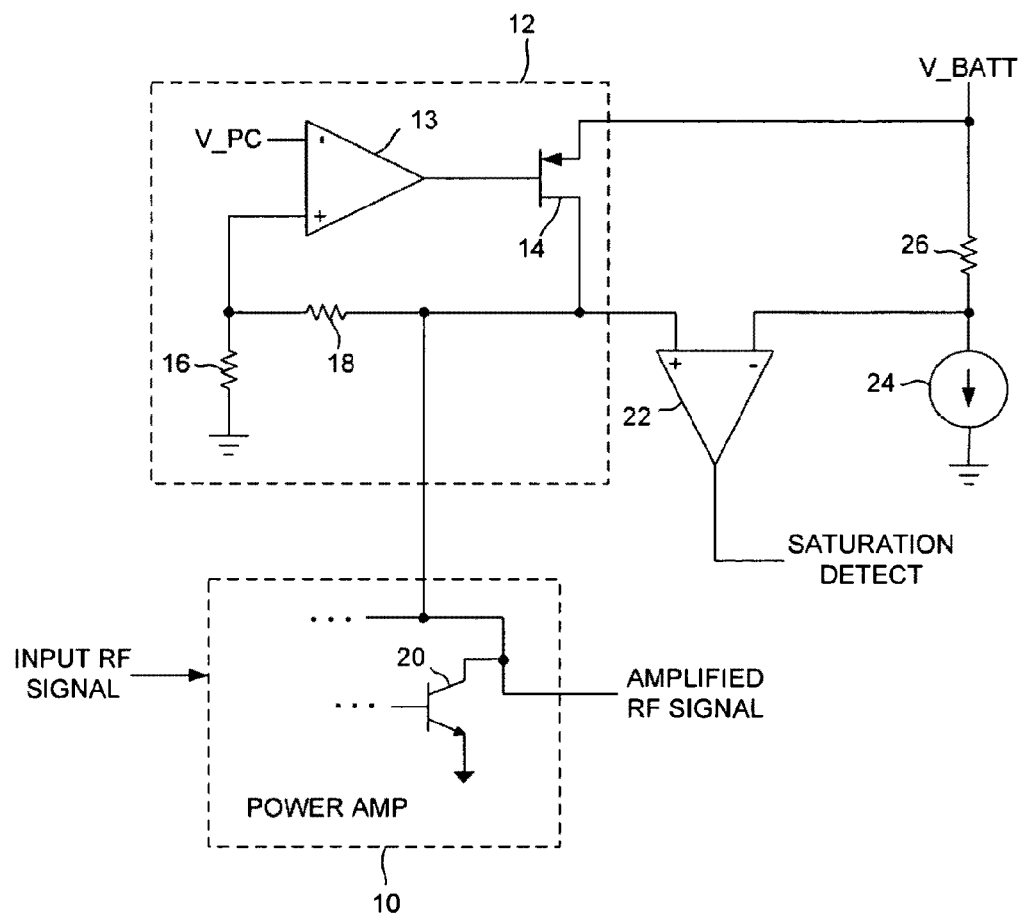
FIG. 1 is a schematic diagram of a portion of a prior power amplifier system having saturation detection circuitry.
Figure 2:
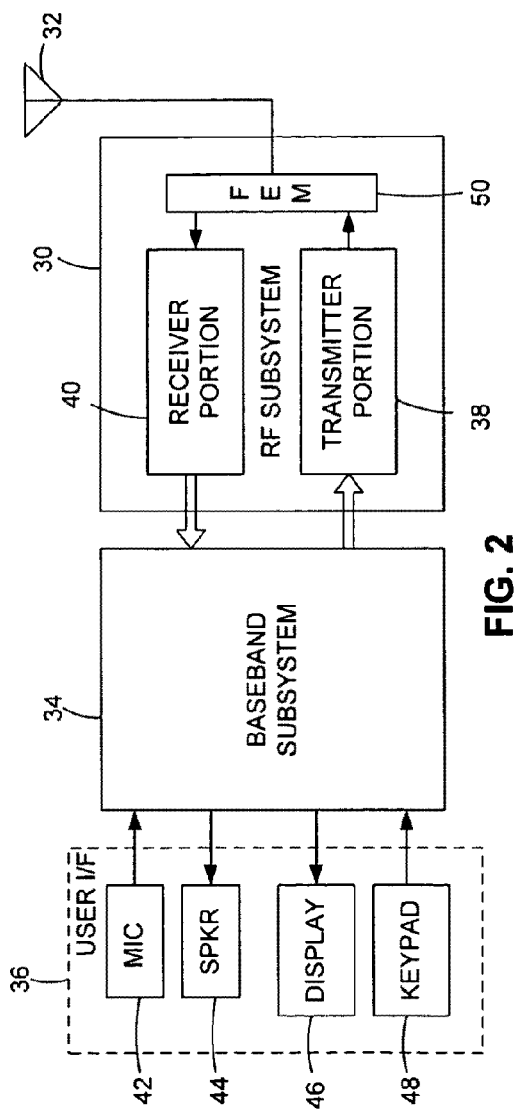
FIG. 2 is a block diagram of a mobile wireless telephone, in accordance with an exemplary embodiment of the present invention.

As illustrated in FIG. 2, in accordance with an exemplary embodiment of the invention, a mobile wireless telecommunication device, such as a cellular telephone, includes a radio frequency (RF) subsystem 30, an antenna 32, a baseband subsystem 34, and a user interface section 36. The RF subsystem 30 includes a transmitter portion 38 and a receiver portion 40. User interface section 36 includes a microphone 42, a speaker 44, a display 46, and a keyboard 48, all coupled to baseband subsystem 34. The output of transmitter portion 38 and the input of receiver portion 40 are coupled to antenna 32 via a front-end module (FEM) 50 that allows simultaneous passage of both the transmitted RF signal produced by transmitter portion 38 and the received RF signal that is provided to receiver portion 40. But for transmitter portion 38, the above-listed elements can be of the types conventionally included in such mobile wireless telecommunication devices. As conventional elements, they are well understood by persons of ordinary skill in the art to which the present invention relates and, accordingly, not described in further detail in this patent specification ("herein"). However, unlike conventional transmitter portions of such mobile wireless telecommunication devices, transmitter portion 38 embodies power amplifier saturation detection features and methods, described in further detail below. It should be noted that while the invention is described in the context of an exemplary embodiment relating to a mobile wireless telephone, the invention alternatively can be embodied in other devices that include mobile or portable RF transmitters.

Figure 3:
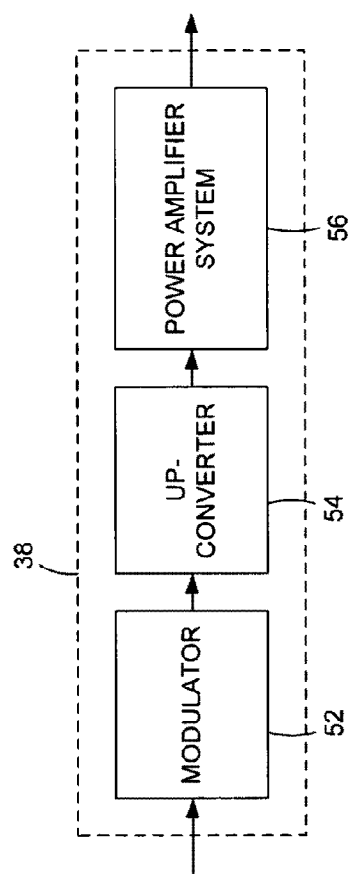
FIG. 3 is a block diagram of the transmitter portion of the mobile wireless telephone shown in FIG. 2.

As illustrated in FIG. 3, a modulator 52 in transmitter portion 38 receives the signal that is input to transmitter portion 38. Modulator 52 modulates the input signal and provides the modulated signal to an upconverter 54. Upconverter 54 shifts or upconverts the frequency of the modulated signal from a baseband frequency to a transmit frequency and provides the upconverted signal to a power amplifier system 56. Although not shown in FIG. 2 or 3 for purposes of clarity, power amplifier system 56 can also receive one or more control signals from a system controller, which can be included in baseband subsystem 34 or other suitable element. Such control signals typically relate to adjusting amplifier gain, bias, and other amplifier parameters.

Figure 4:
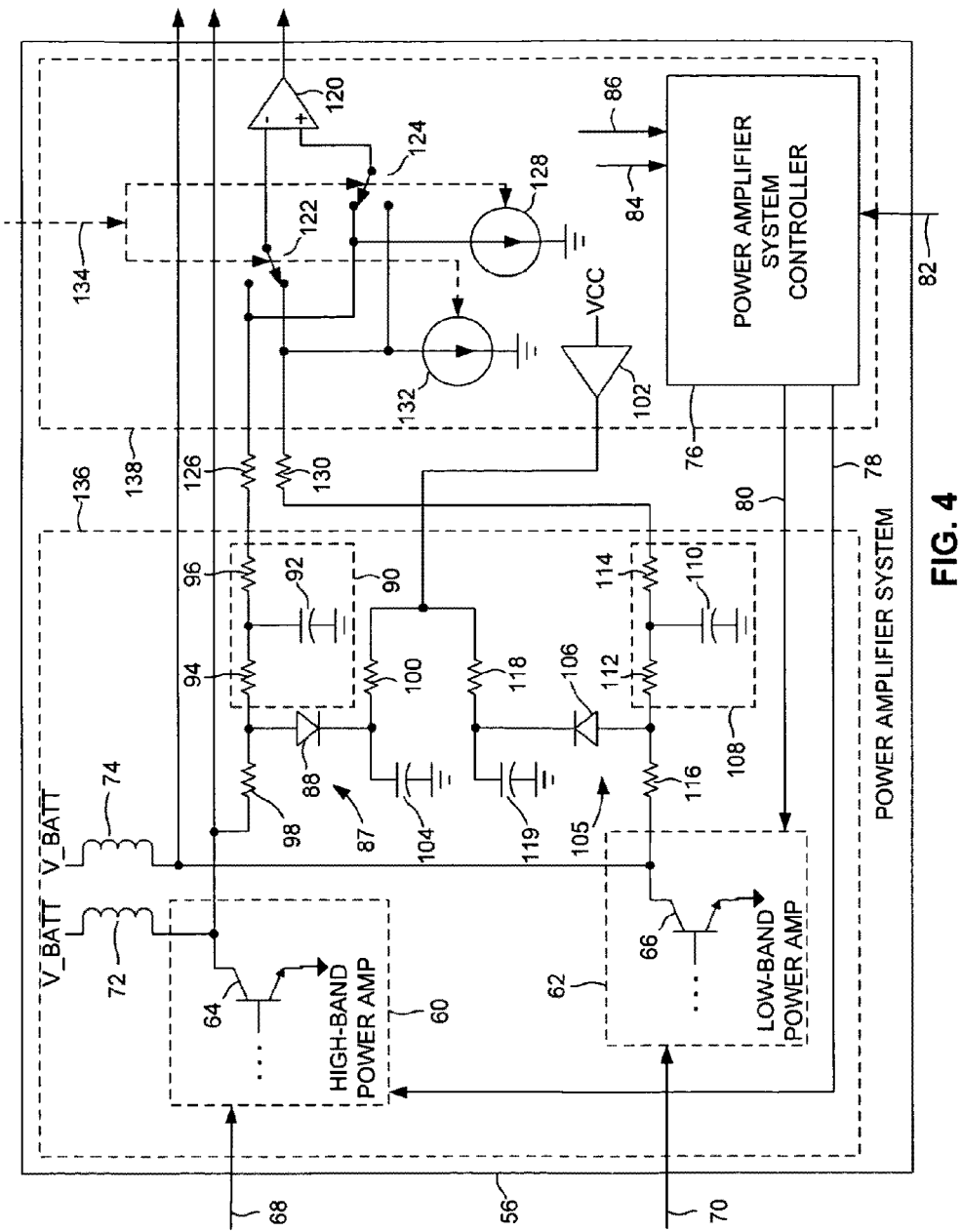
FIG. 4 is a block diagram of the power amplifier system shown in FIG. 3.

As illustrated in FIG. 4, power amplifier system 56 is based upon a high-band power amplifier 60 and a low-band power amplifier 62. Although the invention is described with regard to an exemplary embodiment in which the transmitter is of the dual-band type, capable of transmitting in a selected one of two frequency bands (referred to herein as high band and low band), the invention is applicable to power amplifier systems having as few as a single band and corresponding single power amplifier. Power amplifiers 60 and 62 can be of a conventional type and can include a number of cascaded stages, but only the transistor 64 of the final stage of power amplifier 60 and the transistor 66 of the final stage of power amplifier 62 are shown for purposes of clarity (other such stages and biasing circuitry being indicated by the ellipsis (" . . . ") symbol). High-band power amplifier 60 receives an RF signal 68 to be amplified, and low-band power amplifier receives an RF signal 70 to be amplified. Note that power amplifiers 60 and 62 are not of the COVAC type; rather, the collector terminals of transistors 64 and 66 are coupled directly to the power supply voltage (V_BATT) via inductances 72 and 74, respectively. (As used herein, the term "coupled" means connected via zero or more intermediate elements.) The power supply voltage can be that which is provided by a suitable battery-based power supply circuit (not shown for purposes of clarity) of the type commonly included in mobile wireless telecommunication devices.

Power amplifier system 56 can further include a power amplifier system controller 76 that provides power control signals 78 and 80 to power amplifiers 60 and 62, respectively.

Power amplifier system controller 76 can operate in response to power control signals 82 that it receives from a centralized device controller (not shown) in baseband subsystem 34 (FIG. 2) or other suitable portion of the mobile wireless telecommunication device. Power amplifier system controller 76 can further operate in response to feedback signals 84 and 86 that are respectively representative of the transmitted high-band and low-band RF signal power. As such a feedback control loop is conventional in mobile wireless telecommunication devices, it is well understood by persons of ordinary skill in the art and, accordingly, not described in further detail herein.

When a transistor 64 or 66 is not operating in its saturation region, its collector voltage waveform is sinusoidal. It has been found in accordance with the present invention that as a transistor 64 or 66 enters the bipolar device saturation region of its operation, the negative cycle portion of its collector voltage waveform becomes increasingly deformed from a sinusoidal shape. That is, entry into the saturation region affects the negative cycle portion more than the positive cycle portion. As transistor operation moves deeper and deeper into the saturation region, the positive cycle portion remains substantially sinusoidal, but the negative cycle portion becomes increasingly square and increases in duty cycle. Accordingly, a value that represents the ratio between the amount of time the collector voltage waveform is negative and the amount of time the collector voltage waveform is positive, i.e., the duty cycle, can provide an indication of saturation depth. Similarly, it can be noted that a value that represents the approximate average or mean voltage of the negative cycle portion can also provide an indication of saturation depth. In the exemplary embodiment of the invention, the value is determined as described below. It should be noted that although the term "average" or "averaging" is used herein for convenience, the term is not limited to the mathematical average (or mean) or a mathematical process, and encompasses within its scope of meaning all quantities that approximate or correspond to such an average or mean, as illustrated by the operation of the exemplary averaging circuitry described below.

A first limiter circuit 87 that is coupled to the output of high-band power amplifier 60 includes a first diode 88. A first averaging filter 90 that is coupled to the output of first limiter circuit 87 includes a capacitor 92 and two resistors 94 and 96. Biasing resistors 98 and 100 and the voltage provided by a voltage regulator 102 bias diode 88 and define the quiescent operating point of diode 88 to be substantially at the knee voltage of diode 88. In this manner, diode 88 turns on or conducts in response to even small positive voltage excursions or cycle portions of the RF signal at the output of power amplifier 60. When conducting, diode 88 clips the positive voltage excursion or cycle portion of the signal at a value of about one diode drop (0.7 V). Diode 88 is turned off or does not conduct in response to negative voltage excursions or cycle portions of the signal. Thus, first limiter circuit 87 passes the negative cycle portion and blocks or clips the positive cycle portion. A filter capacitor 104 inhibits the RF signal from interfering with the operation of other circuitry.

First averaging filter 90 receives the RF signal negative cycle portion that first limiter circuit 87 passed and low-pass filters or averages it. The output of first averaging filter 90 thus represents an average of the negative cycle portion of the RF signal that is output by high-band power amplifier 60. Stated another way, the output of first averaging filter 90 is representative of the duty cycle, i.e., the ratio between the amount of time that the RF signal that is output by high-band power amplifier 60 is negative and the amount of time that the RF signal that is output by high-band power amplifier 60 is positive. The combination of first limiter circuit 87 and first averaging filter 90 defines a first duty cycle detector.

A second limiter circuit 105 that is coupled to the output of low-band power amplifier 62 includes a second diode 106. A second averaging filter 108 that is coupled to the output of second limiter circuit 105 includes a capacitor 110 and two resistors 112 and 114. Biasing resistors 116 and 118 and the voltage provided by voltage regulator 102 bias diode 106 and define the quiescent operating point of diode 106 to be substantially at the knee voltage of diode 106. When conducting, diode 106 clips the positive voltage excursion or cycle portion of the signal, in the same manner as described above with regard to diode 88. Diode 106 is turned off or does not conduct in response to negative cycle portions. Thus, second limiter circuit 105 passes the negative cycle portion and blocks or clips the positive cycle portion. A filter capacitor 119 inhibits the RF signal from interfering with the operation of other circuitry.

Second averaging filter 108 receives the RF signal negative cycle portion that second limiter circuit 105 passed and low-pass filters or averages it. The output of second averaging filter 108 thus represents an average of the negative cycle portion of the RF signal that is output by low-band power amplifier 62. Stated another way, the output of second averaging filter 108 is representative of the duty cycle, i.e., the ratio between the amount of time that the RF signal that is output by low-band power amplifier 62 is negative and the amount of time that the RF signal that is output by low-band power amplifier 62 is positive. The combination of second limiter circuit 105 and second averaging filter 108 defines a second duty cycle detector.

A comparator circuit includes a comparator 120 and a switching circuit that comprises two single-pole double-throw switch devices 122 and 124. The pole terminal of the first switch device 122 is connected to a first input (e.g., the inverting input) of comparator 120. The pole terminal of the second switch device 124 is connected to a second input (e.g., the non-inverting input) of comparator 120. The first throw terminal of first switch device 122 is coupled to the output of first averaging filter 90 via a resistor 126 and is also connected to a first current source 128. The second throw terminal of first switch device 122 is coupled to the output of second averaging filter 108 via a resistor 130 and is also connected to a second current source 132. The first throw terminal of second switch device 124 is similarly coupled to the output of first averaging filter 90 via resistor 126 and is also connected to first current source 128. The second throw terminal of second switch device 124 is similarly coupled to the output of second averaging filter 108 via resistor 130 and is also connected to second current source 132. Switch devices 122 and 124 and current sources 128 and 132 are responsive to a band-select signal 134. The state of band-select signal 134 indicates either low-band operation or high-band operation. Although not shown for purposes of clarity, other circuitry, which may be included, for example, in baseband subsystem 34 (FIG. 2), generates band-select signal 134 in response to operating conditions in the manner that is conventional and well understood in dual-band mobile wireless telecommunication devices. It can also be noted that, at any given time while the device is transmitting, one of high-band power amplifier 60 and low-band power amplifier 62 is active and the other is inactive in accordance with band-select signal 134. That is, high-band power amplifier 60 and low-band power amplifier 62 are selectably activatable in response to band-select signal 134.

When band-select signal 134 indicates low-band operation, first switch device 122 connects the output of second averaging filter 108 (via resistor 130) to the first input (e.g., the inverting input) of comparator 120, and second switch device 124 connects the output of first averaging filter 90 (via resistor 126) to the second input (e.g., the non-inverting input) of comparator 120. (Band-select signal 134 and the corresponding switch positions are shown in FIG. 4 in the low-band state.) In addition, when band-select signal 134 indicates low-band operation, current source 128 is active, and current source 132 is inactive. However, as high-band power amplifier 60 is inactive during low-band operation, the voltage at the output of first averaging filter 90 is constant. This voltage is level-shifted by the effect of resistor 126 and current source 128. The level-shifted voltage serves as the comparator reference voltage and defines the low-band saturation detection threshold. (Including resistor 126 in the exemplary embodiment provides a convenient means for selecting or setting the low-band saturation detection threshold.)

In low-band operation, as the saturation depth of low-band power amplifier 62 increases, the voltage at the output of second averaging filter 108 (which can be referred to as the Vsat_lo signal) decreases. As the decreasing Vsat_lo signal crosses the low-band saturation detection threshold, comparator 120 produces a high or binary "1" output signal, thereby indicating that low-band power amplifier 62 is operating in (or at least substantially in) saturation. This saturation detection output signal can be provided to power amplifier system controller 76, which responds by adjusting power control signal 80 to indicate a reduction in the target amplifier power level. Alternatively, in other embodiments the saturation detection output signal can be provided to another element, such as a centralized device controller (not shown) in baseband subsystem 34 (FIG. 2), which can in turn respond by adjusting power control signals 82 that power amplifier system controller 76 receives. In such an embodiment, power amplifier system controller 76 in turn responds to the adjusted control signals 82 by adjusting power control signal 80 to indicate a reduction in the target amplifier power level.

As low-band power amplifier 62 responds to the change in power control signal 80 by reducing the power level of its output RF signal, the Vsat_lo signal increases. As the increasing Vsat_lo signal crosses the low-band saturation detection threshold, comparator 120 toggles to produce a low or binary "0" output signal, thereby indicating that low-band power amplifier 62 is no longer operating in saturation.

When band-select signal 134 indicates high-band operation, first switch device 122 connects the output of first averaging filter 90 (via resistor 126) to the first input (e.g., the inverting input) of comparator 120, and second switch device 124 connects the output of second averaging filter 108 (via resistor 130) to the second input (e.g., the non-inverting input) of comparator 120. In addition, when band-select signal 134 indicates high-band operation, current source 132 is active, and current source 128 is inactive. However, as low-band power amplifier 62 is inactive during high-band operation, the voltage at the output of second averaging filter 108 is constant. This voltage is level-shifted by the effect of resistor 130 and current source 132. The level-shifted voltage serves as the comparator reference voltage and defines the high-band saturation detection threshold. (Including resistor 130 in the exemplary embodiment provides a convenient means for selecting or setting the high-band saturation detection threshold.)

In high-band operation, as the saturation depth of high-band power amplifier 60 increases, the voltage at the output of first averaging filter 90 (which can be referred to as the Vsat_hi signal) decreases. As the decreasing Vsat_hi signal crosses the high-band saturation detection threshold, comparator 120 produces a high or binary "1" output signal, thereby indicating that high-band power amplifier 60 is operating in (or at least substantially in) saturation. This saturation detection output signal can be provided to power amplifier system controller 76, which responds by adjusting power control signal 78 to indicate a reduction in the target amplifier power level. As described above with regard to low-band operation, the saturation detection output signal alternatively can be provided to a centralized device controller or other element, which can in turn respond by adjusting power control signals 82 that power amplifier system controller 76 receives. In such an embodiment, power amplifier system controller 76 in turn responds to the adjusted control signals 82 by adjusting power control signal 78 to indicate a reduction in the target amplifier power level.

As high-band power amplifier 60 responds to the change in power control signal 78 by reducing the power level of its output RF signal, the Vsat_hi signal increases. As the increasing Vsat_hi signal crosses the high-band saturation detection threshold, comparator 120 toggles to produce a low or binary "0" output signal, thereby indicating that high-band power amplifier 60 is no longer operating in saturation.

Note that similar variations in reference voltage, diode and resistor values between the high-band and low-band circuitry are canceled by the common-mode rejection properties of comparator 120.

The above-described elements can be distributed over two or more integrated circuit chips 136 and 138 to take advantage of benefits of different chip process technologies. For example, chip 136 can be formed using Indium-Gallium-Phosphide (InGaP) Heterojunction Bipolar Transistor (HBT) technologies, and chip 138 can be formed using silicon BiCMOS technologies that can advantageously integrate bipolar and CMOS devices.

Figure 5:
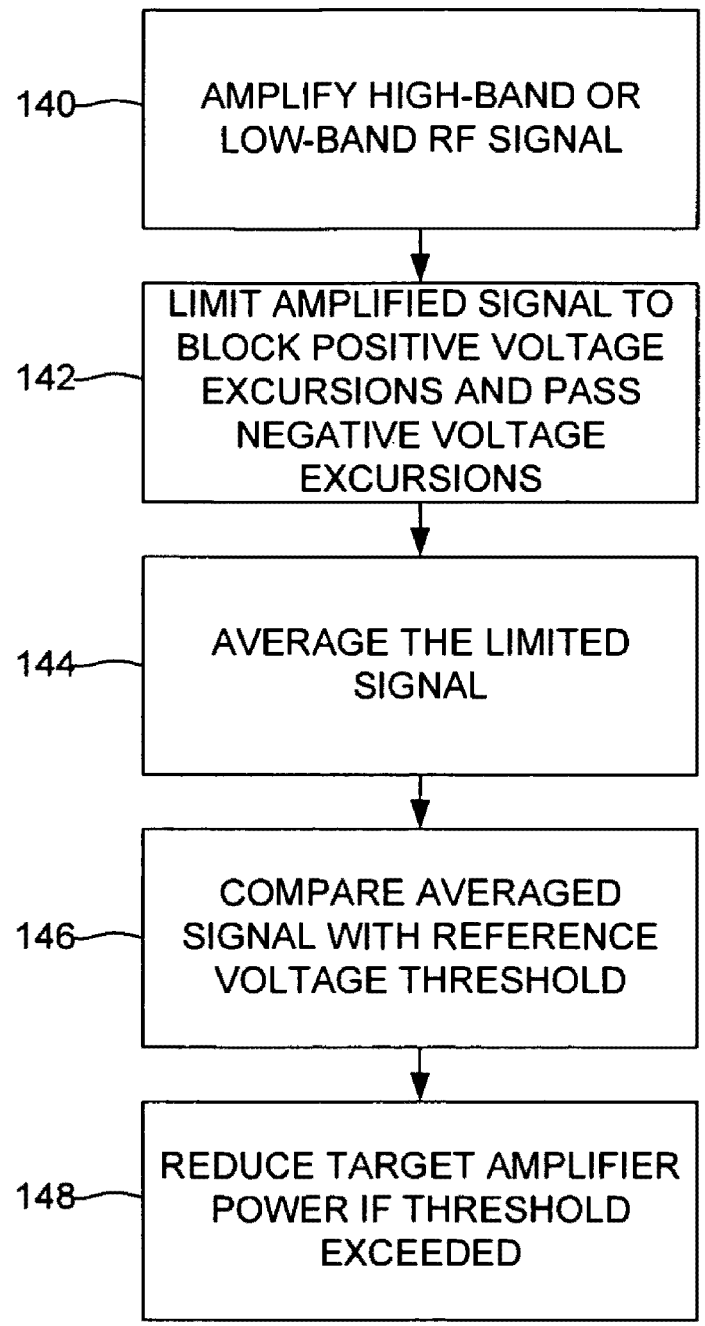
FIG. 5 is a flow diagram illustrating a method of operation of the power amplifier system of FIG. 4.

The operation of the above-described power amplifier system 56 is presented in flow diagram form in FIG. 5. As indicated by block 140, depending on whether the transmitter is operating in high-band or low-band mode, i.e., depending on which of high-band power amplifier 60 or low-band power amplifier 62 is active, either the high-band RF signal or low-band RF signal is amplified. As indicated by block 142, the amplified signal is limited by blocking positive voltage excursions (i.e., the positive cycle portion of the amplified voltage waveform) while passing negative voltage excursions (i.e., the negative cycle portion of the amplified voltage waveform). As indicated by block 144, the limited signal, representing only the negative cycle portion of the waveform, is averaged. This average or mean value provides an indication of saturation depth. As indicated by block 146, this value is compared with a threshold value (e.g., a reference voltage). A reference voltage can be obtained from the output of the inactive one of power amplifiers 60 and 62, which can function as part of a reference voltage circuit in combination with a current source. As indicated by block 148, if the average value falls below the threshold value, a saturation detection signal can be produced. The saturation detection signal can be used by power control circuitry to back off or reduce the target power level for the active one of power amplifiers 60 and 62.

While various embodiments of the invention have been described, it will be apparent to those of ordinary skill in the art that many more embodiments and implementations are possible that are within the scope of this invention. For example, although in the illustrated or exemplary embodiment described above the limiter section, averaging filter section, and comparator section are shown for purposes of illustration as embodied in discrete circuitry, persons skilled in the art will appreciate that some or all of such sections and elements thereof alternatively can be embodied in suitably programmed or configured digital signal processing logic. Accordingly, the invention is not to be restricted except in light of the following claims.

What is claimed is:

1. A power amplifier circuit for a radio frequency (RF) transmitter, the power amplifier circuit comprising:
   a power amplifier including a first output transistor and a second output transistor, the first output transistor including a first output transistor terminal coupled to a first supply voltage, and the second output transistor including a second output transistor terminal coupled to a second supply voltage;
   a first duty cycle detector including: a first input coupled to the first output transistor terminal; a first limiter coupled to the first output transistor terminal, and configured to block positive voltage excursions and to pass negative voltage excursions; and a first averaging filter coupled to an output of the first limiter;
   a second duty cycle detector including: a second input coupled to the second output transistor terminal; a second limiter coupled to the second output transistor terminal, and configured to block positive voltage excursions and to pass negative voltage excursions; and a second averaging filter coupled to an output of the second limiter; and
   a comparator circuit configured to produce a saturation detection output signal, the comparator circuit including a first input and a second input, the first input configured to be coupled to one of the first duty cycle detector and the second duty cycle detector, and the second input coupled to a reference voltage circuit.

2. The power amplifier circuit of claim 1 wherein the first output transistor is configured to operate over a first frequency band and the second output transistor is configured to operate over a second frequency band.

3. The power amplifier circuit of claim 1 wherein the power amplifier is configured to receive a band-select signal and to activate one of the first output transistor and the second output transistor based on the band-select signal.

4. The power amplifier circuit of claim 1 wherein the comparator circuit further includes a switching circuit configured to couple the first input of the comparator circuit to an output of one of the first averaging filter and the second averaging filter based on a band-select signal.

5. The power amplifier circuit of claim 4 wherein the switching circuit includes:
   a first switch responsive to the band-select signal, the first switch including a pole terminal coupled to the first input of the comparator, a first throw terminal coupled to the output of the first averaging filter and a portion of the reference voltage circuit, and a second throw terminal coupled to the output of the second averaging filter and a portion of the reference voltage circuit;
   a second switch responsive to the band-select signal, the second switch including a pole terminal output coupled to the second input of the comparator, a first throw terminal coupled to the output of the first averaging filter and a portion of the reference voltage circuit, and a second throw terminal coupled to the output of the second averaging filter and a portion of the reference voltage circuit.

6. The power amplifier circuit of claim 5 wherein the reference voltage circuit includes:
   a first current source responsive to the band-select signal and coupled to the output of the first averaging filter, the first throw terminal of the first switch device, and the first throw terminal of the second switch device; and
   a second current source responsive to the band-select signal and coupled to the output of the second averaging filter, the second throw terminal of the first switch device, and the second throw terminal of the second switch device.

7. The power amplifier circuit of claim 1 wherein:
   the first limiter includes a first diode and a first biasing circuit, the first biasing circuit configured to bias the first diode to turn on during a positive voltage excursion at the first output transistor terminal and to turn off during a negative voltage excursion at the first output transistor terminal; and
   the second limiter includes a second diode and a second biasing circuit, the second biasing circuit configured to bias the second diode to turn on during a positive voltage excursion at the second output transistor terminal and turn off during a negative voltage excursion at the second output transistor terminal.

8. The power amplifier circuit of claim 1 wherein:
   the first averaging filter includes at least one resistor and at least one capacitor; and
   the second averaging filter includes at least one resistor and at least one capacitor.

9. A method for detecting power amplifier saturation in a radio frequency (RF) transmitter, the method comprising:
   amplifying an RF signal using a first output transistor of a power amplifier when the RF signal is within a first frequency band to obtain a first amplified RF signal and using a second output transistor of the power amplifier when the RF signal is within a second frequency band to obtain a second amplified RF signal, the first output transistor including a first output transistor terminal coupled to a first supply voltage, and the second output transistor including a second output transistor terminal coupled to a second supply voltage;
   detecting a duty cycle of the amplified RF signal by: limiting positive voltage excursions of the first amplified RF signal while passing negative voltage excursions of the first amplified RF signal to produce a first limited signal; limiting positive voltage excursions of the second amplified RF signal while passing negative voltage excursions of the second amplified RF signal to produce a second limited signal; and averaging the first limited signal to produce a first averaged signal and averaging the second limited signal to produce a second averaged signal;
   providing a signal representing the duty cycle to a first input of a comparator circuit and a reference voltage to a second input of the comparator circuit; and
   producing a saturation detection output signal in response to a comparison of the signal representing the duty cycle with the reference voltage.

10. The method of claim 9 further comprising receiving a band-select signal.

11. The method of claim 10 wherein said providing includes:
    coupling the first averaged signal to the first input of the comparator circuit and coupling a reference voltage to the second input of the comparator circuit when the band-select signal indicates a first frequency band operation; and
    coupling the second averaged signal to the second input of the comparator circuit and coupling the reference voltage to the first input of the comparator circuit when the band-select signal indicates a second frequency band operation.

12. The method of claim 9 wherein:
    limiting positive voltage excursions of the first amplified RF signal while passing negative voltage excursions of the first amplified RF signal to produce a first limited signal includes a first diode turning on during a positive voltage excursion and turning off during a negative voltage excursion; and
    limiting positive voltage excursions of the second amplified RF signal while passing negative voltage excursions of the second amplified RF signal to produce a second limited signal includes a second diode turning on during a positive voltage excursion and turning off during a negative voltage excursion.

13. The method of claim 9 wherein:
    averaging the first limited signal includes low-pass filtering the first limited signal; and
    averaging the second limited signal includes low-pass filtering the second limited signal.

14. A mobile wireless telecommunication device, comprising:
    a user interface;
    an antenna;
    a baseband subsystem coupled to the user interface; and
    a radio frequency (RF) subsystem coupled to the baseband subsystem and the antenna, the RF subsystem including a transmitter and a receiver, the transmitter including a modulator, an up converter and a power amplifier system, the power amplifier system including: a power amplifier having a first output transistor and a second output transistor, the first output transistor having a first output transistor terminal coupled to a first supply voltage, the second output transistor having a second output transistor terminal coupled to a second supply voltage; a first limiter section coupled to the first output transistor terminal, the first limiter section blocking positive voltage excursions and limiting negative voltage excursions; a first averaging filter section coupled to an output of the first limiter section; a second limiter section coupled to the second output transistor terminal, the second limiter section blocking positive voltage excursions and passing negative voltage excursions; a second averaging filter section coupled to an output of the second limiter section; and a comparator circuit, the comparator circuit having first and second comparator inputs and producing a saturation detection output signal.

15. The mobile wireless telecommunication device of claim 14, wherein the comparator circuit includes a switching circuit responsive to a band-select signal, the switching circuit configured to:
    couple the first comparator input to an output of the first averaging filter and couple the second comparator input to a reference voltage circuit when the band-select signal indicates a first frequency band operation; and
    couple the first comparator input to an output of the second averaging filter and couple the second comparator input to the reference voltage circuit when the band-select signal indicates a second frequency band operation.

16. The mobile wireless telecommunication device of claim 15 wherein the switching circuit includes:
    a first switch responsive to the band-select signal, the first switch having a pole terminal coupled to the first comparator input, a first throw terminal coupled to the output of the first averaging filter section and a portion of the reference voltage circuit, and a second throw terminal coupled to the output of the second averaging filter section and a portion of the reference voltage circuit;
    a second switch responsive to the band-select signal, the second switch having a pole terminal output coupled to the second comparator input, a first throw terminal coupled to the output of the first averaging filter section and a portion of the reference voltage circuit, and a second throw terminal coupled to the output of the second averaging filter section and a portion of the reference voltage circuit.

17. The mobile wireless telecommunication device of claim 16 wherein the reference voltage circuit includes:
    a first current source responsive to the band-select signal and coupled to the output of the first averaging filter, the first throw terminal of the first switch device, and the first throw terminal of the second switch; and
    a second current source responsive to the band-select signal and coupled to the output of the second averaging filter, the second throw terminal of the first switch device, and the second throw terminal of the second switch.

18. The mobile wireless telecommunication device of claim 14 wherein:
    the first limiter section includes a first diode and a first biasing circuit, the first biasing circuit biasing the first diode to turn on during a positive voltage excursion at the first output transistor terminal and turn off during a negative voltage excursion at the first output transistor terminal; and
    the second limiter section includes a second diode and a second biasing circuit, the second biasing circuit biasing the second diode to turn on during a positive voltage excursion at the second output transistor terminal and turn off during a negative voltage excursion at the second output transistor terminal.

19. The mobile wireless telecommunication device of claim 14 wherein:
    the first averaging filter section includes at least one resistor and at least one capacitor; and
    the second averaging filter section includes at least one resistor and at least one capacitor.

20. A transmitter comprising:
    a modulator;
    an up converter; and
    a power amplifier system including: a power amplifier including a first output transistor and a second output transistor, the first output transistor including a first output transistor terminal coupled to a first supply voltage, the second output transistor including a second output transistor terminal coupled to a second supply voltage; a first limiter section coupled to the first output transistor terminal, the first limiter section blocking positive voltage excursions and limiting negative voltage excursions; a first averaging filter section coupled to an output of the first limiter section; a second limiter section coupled to the second output transistor terminal, the second limiter section blocking positive voltage excursions and passing negative voltage excursions; a second averaging filter section coupled to an output of the second limiter section; and a comparator circuit, the comparator circuit having first and second comparator inputs and producing a saturation detection output signal.

21. The transmitter of claim 20 wherein the comparator circuit includes a switching circuit responsive to a band-select signal, the switching circuit configured to:
    couple the first comparator input to an output of the first averaging filter and couple the second comparator input to a reference voltage circuit when the band-select signal indicates a first frequency band operation; and couple the first comparator input to an output of the second averaging filter and couple the second comparator input to the reference voltage circuit when the band-select signal indicates a second frequency band operation.

22. The transmitter of claim 21 wherein the switching circuit includes:

a first switch responsive to the band-select signal, the first switch having a pole terminal coupled to the first comparator input, a first throw terminal coupled to the output of the first averaging filter section and a portion of the reference voltage circuit, and a second throw terminal coupled to the output of the second averaging filter section and a portion of the reference voltage circuit;

a second switch responsive to the band-select signal, the second switch having a pole terminal output coupled to the second comparator input, a first throw terminal coupled to the output of the first averaging filter section and a portion of the reference voltage circuit, and a second throw terminal coupled to the output of the second averaging filter section and a portion of the reference voltage circuit.

23. The transmitter of claim 22 wherein the reference voltage circuit includes:

a first current source responsive to the band-select signal and coupled to the output of the first averaging filter, the first throw terminal of the first switch device, and the first throw terminal of the second switch; and a second current source responsive to the band-select signal and coupled to the output of the second averaging filter, the second throw terminal of the first switch device, and the second throw terminal of the second switch.

24. The transmitter of claim 20 wherein:

the first limiter section includes a first diode and a first biasing circuit, the first biasing circuit biasing the first diode to turn on during a positive voltage excursion at the first output transistor terminal and turn off during a negative voltage excursion at the first output transistor terminal; and the second limiter section includes a second diode and a second biasing circuit, the second biasing circuit biasing the second diode to turn on during a positive voltage excursion at the second output transistor terminal and turn off during a negative voltage excursion at the second output transistor terminal.

25. The transmitter of claim 20 wherein:

the first averaging filter section includes at least one resistor and at least one capacitor; and the second averaging filter section includes at least one resistor and at least one capacitor.

* * * * *